United States Patent
Merritt

(10) Patent No.: US 6,169,757 B1
(45) Date of Patent: Jan. 2, 2001

(54) INTERMODAL PHASE DIFFERENCE CONTROLLER FOR BEAM ANGLE MODULATION IN INDEX GUIDED SEMICONDUCTOR DEVICES

(75) Inventor: Scott A. Merritt, 408 Colin La., Vienna, VA (US) 22180

(73) Assignee: Scott A. Merritt (GB)

( * ) Notice: Under 35 U.S.C. 154(b), the term of this patent shall be extended for 0 days.

(21) Appl. No.: 08/938,368

(22) Filed: Sep. 26, 1997

(51) Int. Cl.$^7$ ....................................................... H01S 5/00
(52) U.S. Cl. .................................................. 372/50; 372/26
(58) Field of Search ................................ 385/28, 50, 40; 372/50, 26

(56) References Cited

U.S. PATENT DOCUMENTS

| | | | |
|---|---|---|---|
| 4,296,386 | 10/1981 | Tijburg et al. | 331/94.5 |
| 5,003,550 | 3/1991 | Welch et al. | 372/50 |
| 5,216,729 | * 6/1993 | Berger et al. | 385/31 |
| 5,233,623 | 8/1993 | Chang | 372/46 |
| 5,319,659 | 6/1994 | Hohimer | 372/45 |
| 5,379,354 | * 1/1995 | Jenkins et al. | 385/46 |
| 5,410,625 | * 4/1995 | Jenkins et al. | 385/130 |
| 5,524,013 | 6/1996 | Nakatsuka et al. | 372/24 |
| 5,524,156 | * 6/1996 | Ver Der Toi | 385/28 |
| 5,703,895 | * 12/1997 | Ghirardi et al. | 372/50 |
| 5,799,119 | * 8/1998 | Rolland et al. | 385/45 |

* cited by examiner

Primary Examiner—Rodney Bovernick
Assistant Examiner—Q. P. Leung
(74) Attorney, Agent, or Firm—Burns, Doane, Swecker and Mathis, L.L.P.

(57) ABSTRACT

A novel device and method of beam steering for semiconductor lasers or optical amplifiers is disclosed. The method of the present invention achieves high signal extinction ratios, high speed, low chirp modulation by biasing a multi-lateral mode beam steering section. The device of the present invention comprises an active single vertical and lateral mode optical waveguide, a multi-lateral mode waveguide, and a mode converter. The mode converter efficiently couples output from an active single mode waveguide to two or more modes of a multi-lateral mode waveguide. Two guided modes arrive at a device facet with a particular intermodal phase difference based on initial mode phasing, multi-lateral mode waveguide length and modal dispersion properties, and facet angle. Beam steering is achieved through carrier antiguiding effect by injecting current into the multi-lateral mode waveguide from the mode converter thus changing the intermodal dispersion. Changing the intermodal phase difference changes the direction of beam propagation relative to the device facet, providing enhanced beam steering.

19 Claims, 9 Drawing Sheets

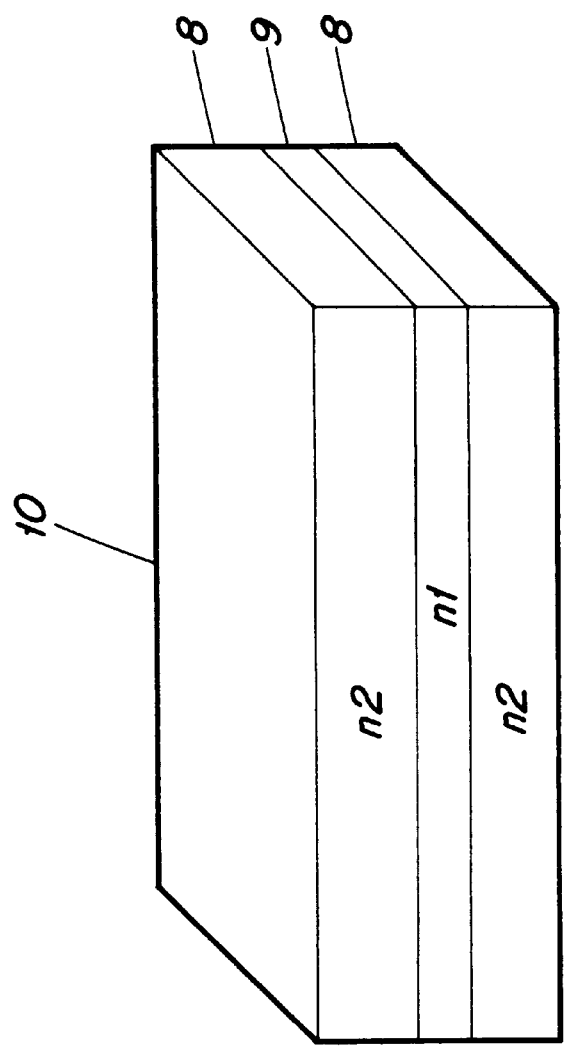
FIG. 1
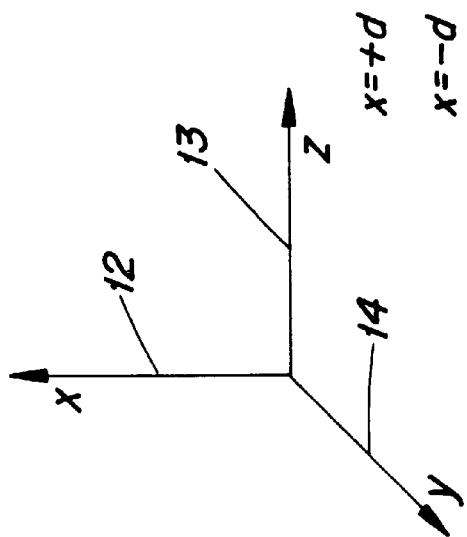

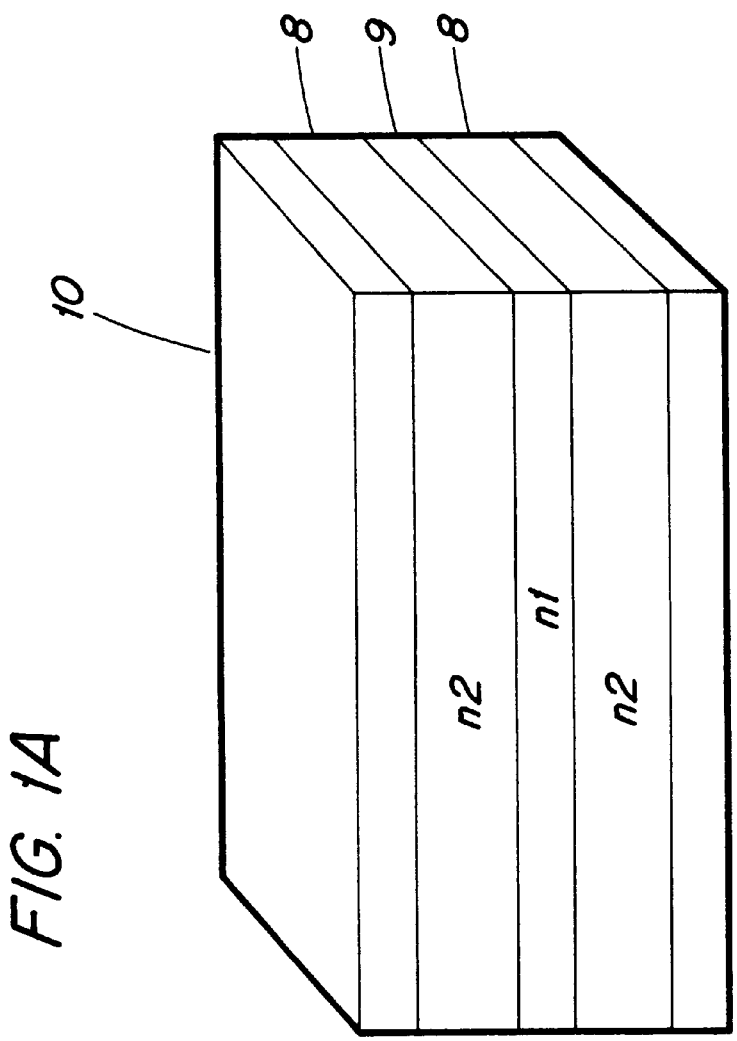
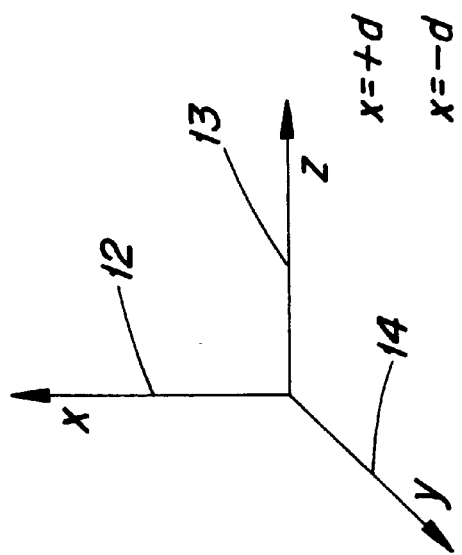
FIG. 1A

FIG. 2
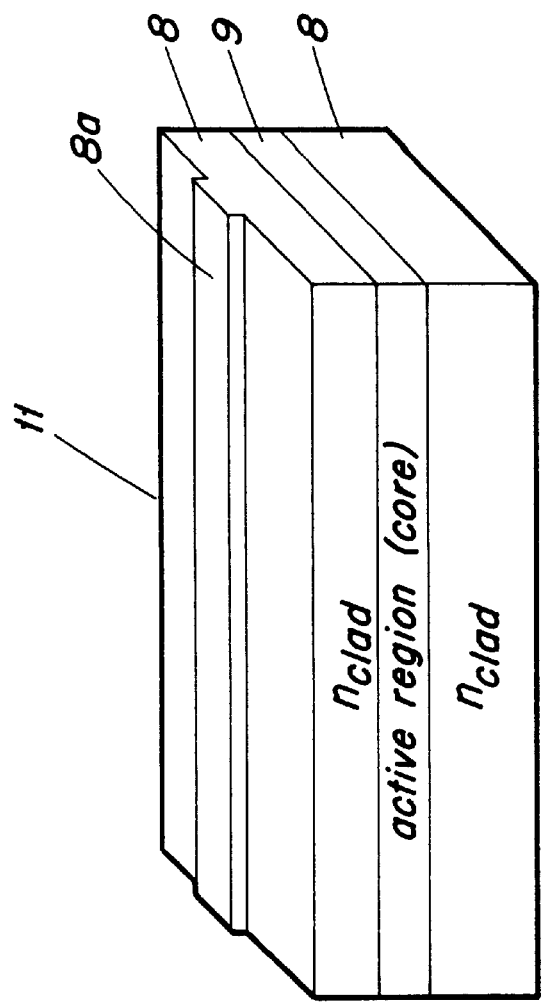
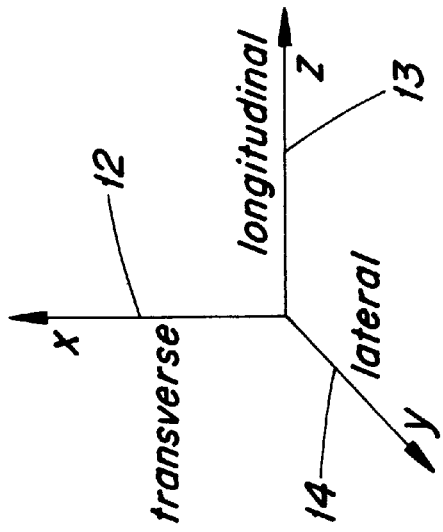

INTERMODAL PHASE DIFFERENCE CONTROLLER FOR BEAM ANGLE MODULATION IN INDEX GUIDED SEMICONDUCTOR DEVICES

FIELD OF THE INVENTION

The present invention is in the field of optoelectronics, including semiconductor laser diodes and semiconductor laser diode based optical amplifiers. In particular, the present invention relates to a novel apparatus and a method for signal modulation and control of signal coupling in semiconductor laser diodes and semiconductor laser diode optical amplifiers.

BACKGROUND OF THE INVENTION

Fiber optics and semiconductor lasers are now essential telecommunications technologies. Given the drastic increase in demand for high speed information transfer, the increased use of high bandwidth optical communications is a natural solution to increasing bandwidth demands. Fiber optic systems are capable of transferring high symbol rate signals over long distances with low attenuation using dielectric waveguides in the form of optical fibers. Optical fibers are cylindrical dielectric waveguides and offer a better bitrate times distance product than copper wires for a given attenuation or signal to noise ratio. However, in order to derive maximum usefulness from optical sources and ensure the highest data transfer capabilities, high bandwidth, high extinction ratio modulation techniques and device structures are critical. Such techniques and structures must be directed toward maximizing the signal to noise ratio at the receiver or receivers.

Methods for modulating the beams of laser diodes, optical amplifiers, and other optical devices are instrumental for facilitating the high-speed transfer of information across optical conduits. Improved modulation methods further are useful in minimizing factors such as signal loss due to poor signal coupling from one device to another. Prior art modulation of semiconductor laser diodes typically involves direct modulation of the injection luminescence current or external modulation of the optical beam usually through a Mach-Zehnder (MZ) interferometer or device of like kind.

Integrated MZ interferometers or related devices use a single mode input waveguide which is split into two branches of equal or nearly equal length and then recombined into a single mode waveguide. When a single bias voltage or multiple bias voltages are applied to one or both of the branches, a phase difference occurs between the two optical signals. A controllable amount of constructive or destructive interference occurs when these two optical signals are combined in such a manner. By controlling the amount of bias voltage applied to the branches, and thus the amount of constructive or destructive interference between signals, the amplitude of the recombined output signal can be modulated.

MZ based modulators must be constructed from an electro-optic material in which the refractive index is a function of applied voltage such as lithium niobate. Because such materials tend to be relatively costly, external MZ or related modulators are extremely expensive compared to direct modulation.

Direct modulation of a semiconductor laser by varying the magnitude of the applied injection luminescence current imposes an amplitude variation in the laser element. Controlled amplitude variations constitute the signal. While direct modulation is effective at signal constitution, it does not affect nor control the direction of the optical beam. Direct modulation may also cause transient, undesired wavelength shifts commonly referred to as "chirp" and capable of degrading pulse shape when the optical signal travels in a dispersive media such as optical fiber.

Direct modulation also restricts dynamic range and reduces the extinction ratio of the signal since the modulation current is varied about a bias point nearly midway between the laser threshold current and the maximum current for safe operation. Dynamic range refers to the ratio of maximum output signal power to the minimum output signal power subject to a signal fidelity criteria such as 1 dB compression and usually applied to analog transmission. Extinction ratio refers to the ratio of peak output with an applied input signal set at a maximum level to the minimum output power with no input signal applied. Thus the limited dynamic range and extinction ratio of prior art modulation techniques limit performance when used to conduct optical telecommunications.

For example, if the sum of the bias and modulation currents are below laser threshold, as they typically are during low signal level constitution, the optical signal is extinguished. During high signal level generation, the signal may be "clipped". Clipping is problematic for analog optical signals requiring signal fidelity. Conversely, if the bias point is selected closer to the maximum safe current to avoid low-level clipping, device reliability may be impaired and "idle channel" noise may be increased. Idle channel noise may be particularly problematic in multichannel optical communications.

If many such high-biased lasers are interconnected over an optical network for example, the aggregate optical noise degrades the performance of signal processing devices such as signal demultiplexers and detectors supporting the operation of the network. High bias levels however do increase the intrinsic speed of the semiconductor lasers since the relaxation frequency increases with optical power. Moreover, direct modulation at high bit rates or high frequencies requires fast driver circuits capable of handling relatively large currents since the entire device is "pumped" with current. Providing both high speed and high bias levels within a driver circuit complicates the design of the driver. High speed operation using direct modulation may also be limited by device capacitances.

Capacitances inherently present as an unavoidable consequence of the physical design and construction of a semiconductor device may affect the operation of the device especially at high speeds. High speed operation therefore requires optimization of junction design to reduce parasitic device capacitances. Such optimization usually requires, among other measures, minimizing the length of the device.

Prior art methods for optimizing transmission include beam control for focusing and steering. Such methods are disclosed, for example in U.S. Pat. No. 5,524,013 issued to Nakatsuka, et al on Jun. 4, 1996. Nakatsuka, et al discloses a Beam Scannable Laser Diode wherein the position and emitting direction of a laser beam can be varied by controlling injection currents. By modulating injection currents, the electron distribution and refractive index profile for the optical media may be modified. Nakatsuka, et al relies on changing the refractive index profile to bend an incumbent beam in a manner similar to a gradient index lens by lateral diffraction. One disadvantage of Nakatsuka, et al is that the device is gain guided in the lateral dimension giving rise to astigmatism leading to poor beam quality. Moreover, gain guiding diminishes the beam steering benefits when such a device is operated at low power. Another disadvantage of Nakatsuka, et al is the need for an integral lens. Not only does such a lens require additional dry etching steps to construct, but the use of such a lens leads to optical aberrations including undesirable "coma".

U.S. Pat. No. 5,319,659 issued to Hohimer on Jun. 7, 1994 discloses a Semiconductor Diode Laser Having an Intra cavity Spatial Phase Controller for Beam Control and Switching. In such prior art laser devices, steering and switching of a single mode signal are accomplished by means of integrating Intra cavity controllers disposed within an electrical contact metallization layer during laser fabrication. Hohimer however does not accommodate multiple lateral waveguide modes.

To best appreciate method and apparatus in the claimed invention disclosed hereinafter, an understanding of the fundamental characteristics of the dielectric waveguide are essential. For a complete understanding of the underlying theory of dielectric optical waveguides, "Theory of Dielectric Optical Waveguides", Dietrich Marcuse, Academic Press 1974, incorporated herein by reference, may be referred to. In a dielectric slab waveguide, electromagnetic energy propagates within a region of high permittivity surrounded by dielectric material of a lower permittivity. Because of the simplicity of construction and geometry, slab waveguides can be easily characterized with mathematical expressions and are regularly used in integrated optical devices. Such simplicity therefore makes predicting the behavior of electromagnetic energy within the slab waveguide relatively easy using known mathematical relationships.

Behavior of Electromagnetic Waves in Dielectric Waveguides

A dielectric waveguide is a structure in which electromagnetic energy is confined to and propagates in a region of higher permittivity surrounded by dielectric material of lower permittivity. The behavior of the fields in dielectric waveguides is described in part using the following well known equations:

Gauss's Law $$\nabla \cdot \vec{D} = \rho \quad (1)$$

Faraday's Law $$\nabla \times \vec{E} = \frac{-\partial \vec{B}}{\partial t} \quad (2)$$

No Magnetic Monopoles $$\nabla \cdot \vec{B} = 0 \quad (3)$$

Ampere's Law $$\nabla \times \vec{H} = \vec{J} + \frac{\partial \vec{D}}{\partial t} \quad (4)$$

where $\vec{D}$ is the electric flux density vector, $\vec{B}$ is the magnetic flux density vector, $\vec{E}$ is the electric field vector, $\vec{H}$ is the magnetic field vector, $\rho$ is the free charge source density, and $\vec{J}$ is the current source density vector. The flux density vectors are related to the field vectors by the constitution equations:

$$\vec{D} = \varepsilon_0 \vec{E} + \vec{P} \quad (5)$$

$$\vec{B} = \mu_0(\vec{H} + \vec{M}) \quad (6)$$

where $\epsilon_0 = 8.854 \cdot 10^{-12}$ Farads/meter and $\mu_0 = 4\pi \cdot 10^{-7}$ Henrys/meter are the permittivity and permeability of free space, respectively.

For the special case of non magnetic media, the magnetization field $\vec{M} = \vec{0}$ so $\vec{B} = \mu_0 \vec{H}$. In linear isotropic dielectric media, the relation between the electric field and electric polarization is given by:

$$\vec{P} = \varepsilon_0 \chi_e \vec{E} \quad (7)$$

$$\vec{D} = \varepsilon(x, y, z)\vec{E} \quad (8)$$

$$\epsilon(x, y, z) = (1 + \chi_e(x, y, z))\epsilon_0 \quad (9)$$

where $\chi_e$ is called the electric susceptibility and $(1+\chi_e(x, y, z))$ is the relative permittivity. In source free media, $\rho=0$ and $J=0$. Accordingly, the curl of Faraday's law (Equation 2) and of Ampere's law (Equation 4) may be combined with the vector identity $\nabla^2 \vec{V} = \nabla(\nabla \cdot \vec{V}) - \nabla \times \nabla \times \vec{V}$ to yield the vector wave equation:

$$\left(\frac{\partial^2}{\partial x^2} + \frac{\partial^2}{\partial y^2} + \frac{\partial^2}{\partial z^2}\right)\vec{V} = \mu_0 \varepsilon \frac{\partial^2 \vec{V}}{\partial t^2} \quad (10)$$

which holds for each of the components of $\vec{V}$, where $\vec{V}$ is either $\vec{E}$ or $\vec{H}$. Specializing further to the case of time-harmonic waves, the temporal dependence of all three vector quantities $V_q$ is given by $V_q(x, y, z, t) = \psi_q(x, y, z) e^{j\omega t}$ and Equation (10) reduces to the Helmholtz equation for phasor fields:

$$\left(\frac{\partial^2}{\partial x^2} + \frac{\partial^2}{\partial y^2} + \frac{\partial^2}{\partial z^2}\right)\psi_q = -k^2(x, y, z)\psi_q \quad (11)$$

where $k^2(x, y, z) = \omega^2 \mu_0 \epsilon(x, y, z)$

When time-harmonic waves propagate in a uniform waveguide, the overall dependence on time and longitudinal distance, z, is given by $\exp\{j(\omega t - \beta(\omega)z)\}$, where $\beta(\omega)$ is a modal propagation constant yet to be determined and $\omega = 2\pi c/\lambda$ where $\lambda$ is a particular wavelength of light in free space. Since $\partial^2 \psi_z / \partial z^2 = -\beta^2(\omega)\psi_z$, the scalar Helmholtz equation for the z component of the electric field can be expressed as a two dimensional time-independent Schrödinger equation:

$$\nabla\perp^2 \psi_z + k^2(x, y)\psi_z = \beta^2(\omega)\psi_z \quad (12)$$

where $\nabla\perp = \vec{x}(\partial/\partial x) + \vec{y}(\partial/\partial y)$ is the perpendicular gradient operator and $\nabla\perp^2 = \partial^2/\partial x^2 + \partial^2/\partial y^2$ is the two dimensional Laplacian operator. Equation (12) must be solved by utilizing the boundary conditions between materials of different permittivity.

Since Maxwell's equations allow us to express the transverse field components $\vec{E}\perp = (\vec{x} E_x + \vec{y} E_y)$ and $\vec{H}\perp = (\vec{x} H_x +$ $\vec{y} H_y$) in terms of the longitudinal components $E_z$, and $H_z$, it is only necessary to solve Equation (11) once. If $E_z=0$ then the non zero electric field components are transverse to the direction of propagation; such modes are called "transverse electric" or TE modes. Similarly, if $H_z=0$ then the magnetic field and the modes "transverse magnetic" or TM. Modes which have non zero longitudinal components of both the electric and magnetic fields and which have the same propagation constant, β, are called hybrid modes.

Using known mathematical behavior of electromagnetic waves and, in particular, the behavior of such waves in a dielectric slab waveguide, signals may be modulated in a number of ways. Such modulation may be determined by the method which optimizes, for example, the coupling efficiency for a particular media.

Optimization of optical coupling and transmission may also be affected by beam alignment between coupled devices. Notwithstanding advances in the art, the alignment between optical fibers, semiconductor lasers, and optical amplifiers is extremely difficult due to the small alignment tolerances demanded. Active alignment is typically performed using the optical signal from the device and a position control loop. Using feedback information related to signal intensity, a position control loop may affect a change in the beam alignment to optimize the optical power coupled to a fiber. Active alignment techniques require expensive alignment equipment and highly trained personnel and thereby reduce productivity in module manufacture.

OBJECTS OF THE INVENTION

It is an object therefore of the present invention to provide a method and apparatus for overcoming the disadvantages in the prior art. Specifically, it is an object of the present invention to provide a method and apparatus for beam steering that consumed little additional power, that provided high modulation bandwidth, and that provided high dynamic range and large extinction ratios with an integrated beam structure.

It is another object of the present invention to provide a method and apparatus for aligning the external optical components and one or more beams of a semiconductor laser or optical amplifier to provide optimal coupling without resorting to positioner-based active alignment techniques.

It is still another object of the present invention to provide a method for beam steering without resorting to multiple radiating elements.

It is still another object of the present invention to provide a method for beam steering using index guiding and carrier anti-guiding effect thus avoiding beam astigmatism caused by internally refracting the beam using gain guiding.

It is still another object of the invention to provide a method and apparatus for beam steering that did not rely on thermal effects since such effects compromise modulation speed.

SUMMARY OF THE INVENTION

The intermodal phase difference controller of the present invention uses a novel method of beam steering to modulate the optical signal of semiconductor lasers or optical amplifiers. Beam steering changes the direction of the optical signal and thus controls the coupling of the semiconductor laser or optical amplifier to the transmission medium and/or other optical elements such as the receiver. The intermodal phase difference controller of the present invention utilizes effective signal coupling and modulation from a single mode laser or amplifier signal propagating in a single mode waveguide to multiple modes in a multi-mode waveguide integral to the laser or amplifier. The intermodal phase difference controller is capable of achieving high signal extinction ratios because the beam can be steered away from other optical elements. Beam steering is capable of achieving high speed, low chirp modulation since the semiconductor laser or optical amplifier section is biased independently of the smaller beam steering section.

The beam steering method of this invention offers the advantages of external modulation, namely, reduced amplitude to phase (AM-to-PM) conversion thereby producing nearly chirp-free operation. The beam steering method of the present invention also offers a reduction in the amount of junction and parasitic capacitances through reduction in the area subject to the modulating current. By lowering capacitance, high speed modulation is accordingly enabled.

The beam steering method of the present invention may be practiced on a device comprising a single vertical and lateral mode optical waveguide, a mode converter, a multi-lateral mode waveguide, and controlling electrodes. All waveguide modes are fundamental in the direction normal to the semiconductor layer structure and semiconductor epitaxial surface and may be referred to as vertical mode. Transmission in the vertical mode is often referred to as the "transverse" mode in the semiconductor laser diode literature. The waveguide's later mode structure, e.g., single or multi-lateral modality, further may be referenced to the plane of the semiconductor laser layer structure. Transmission mode may also be referred to as perpendicular and parallel to the junction plane, respectively.

The mode converter of the present invention efficiently couples the output of a single mode waveguide to two or more lateral modes of a multi-lateral mode waveguide. In one embodiment, a mode converter couples the single mode output nearly equally to a multi-lateral mode waveguide supporting only two guided modes. The two guided modes travel in a multi-lateral mode with slightly different velocities due to the modal dependence of waveguide dispersion also referred to as modal dispersion. The two guided modes therefore arrive at the device facet with a particular intermodal phase difference based on the initial mode phasing, the length and the modal dispersion properties of the multi-lateral mode waveguide, and the angle of the facet with respect to the multi-mode waveguide.

Beam steering is effected by correctly injecting the multi-lateral mode waveguide from the mode converter and by changing the intermodal phase difference. The modal dispersion can be changed using the carrier antiguiding effect to inject current in the multi-lateral mode index guided waveguide. Carrier antiguiding effect is the reduction in the refractive index in the semiconductor by increasing carrier density. The change in the refractive index affects the individual modal phase velocities, confinement factors, and the difference between individual phase velocities. The intermodal phasing at the device facet can be controlled with both or either of these effects. Angling the facet with respect to the waveguide establishes an initial beam pointing direction, changes the modal reflectance, and increases intermodal coupling in the reflected signal. The intermodal phase difference changes the direction that the beam propagates relative to the device facet, effecting the beam steering method of the present invention.

BRIEF DESCRIPTION OF THE DRAWINGS

FIG. 1 is a diagram illustrating a basic dielectric slab waveguide showing the guiding or core layer of refractive index n1 and cladding layers of refractive index n2.

FIG. 1A is a diagram illustrating a dielectric slab waveguide as shown in FIG. 2 having multiple layers.

FIG. 2 is a diagram of a dielectric ridge waveguide showing transverse, longitudinal, and lateral orientations.

DETAILED DESCRIPTION OF THE INVENTION

Figure 3:
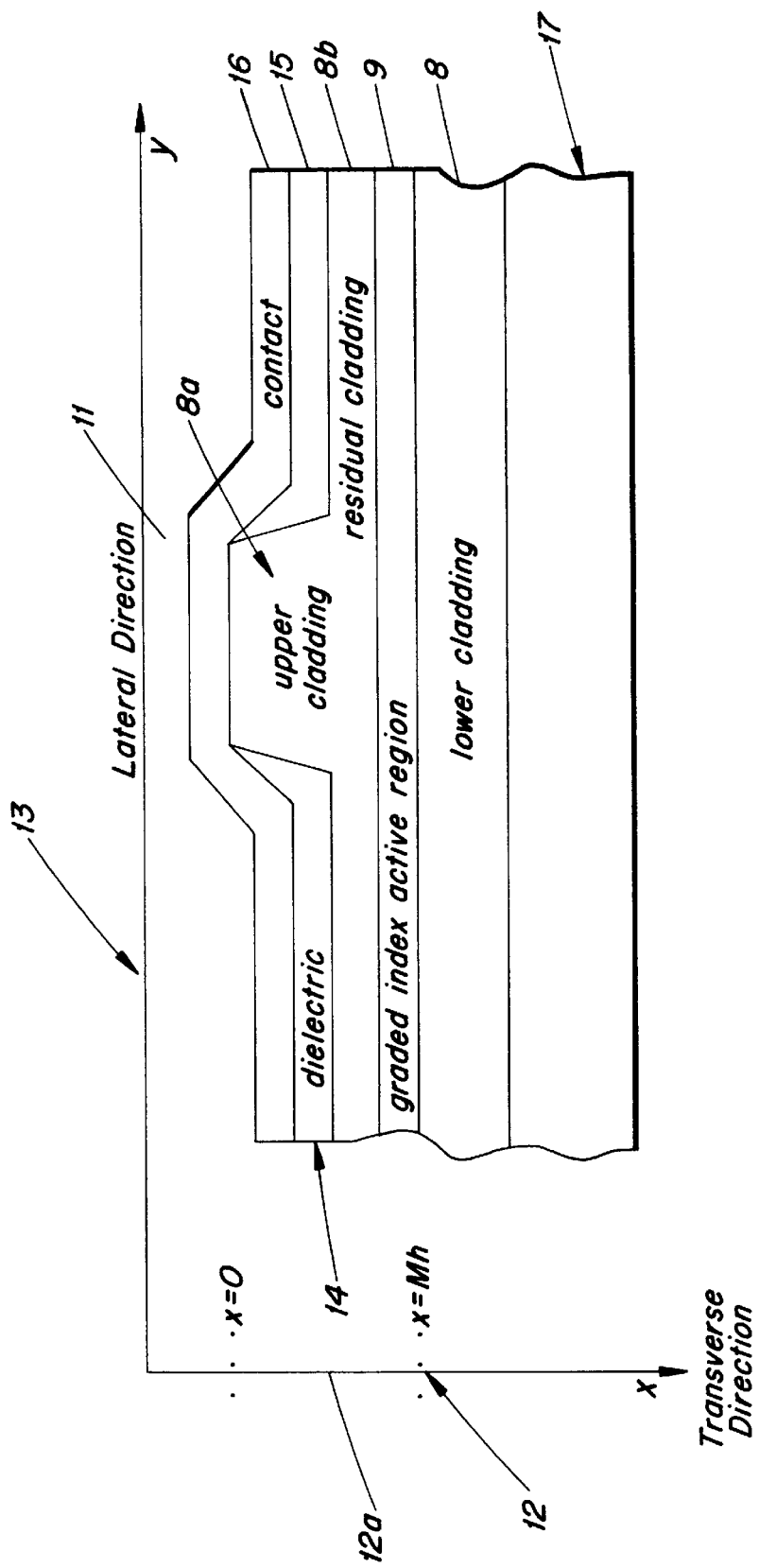
FIG. 3 is a diagram illustrating a cross section of components of the single or multi-lateral dielectric ridge waveguide of the present invention.

Equation (10) poses a boundary value problem which may be solved by various eigencharacterization methods. The square of the propagation constant, $\beta^2$, and longitudinal field component, $\psi_z$, are the eigenvalue and eigenfunction which are sought. In simple cases, the forms of the eigenfunction in all regions is known. When these forms are substituted into the time-independent Schrödinger equation, the result is a single, often transcendental, equation called the determinental equation. The square of the propagation constant, $\beta^2$, is a root of the determinental equation.

3-Layer Dielectric Slab Optical Waveguide

In the case of dielectric slab waveguide 10, as best shown in FIG. 1, a core region 9 of refractive index $n_1$ is sandwiched between cladding regions 8 of refractive index $n_2 < n_1$. To characterize the behavior of waves in waveguide 10 the following boundary conditions may be used:

$$\frac{H_{z1}}{E_{y1}} = \frac{H_{z2}}{E_{y2}} \quad (13)$$

for TE modes, and $$\frac{E_{z1}}{H_{y1}} = \frac{E_{z2}}{H_{y2}} \quad (14)$$

for TM modes, at $x = \pm d$. Refractive indices of regions 8 and 9 may be complex and are related to the permittivities of the respective dielectrics used in regions 8 and 9 by the expression $n_i = \sqrt{\epsilon_i/\epsilon_0}$ (i=1,2). The optical frequency, $\omega$, is obtained from the free space wavelength, $\lambda = 2\pi c/\omega$, or the free-space wave number, $k_0 = \omega/c = 2\pi/\lambda$, where $c = 1/\sqrt{\mu_0 \epsilon_0}$ is the speed of light in vaccuo. Variation of the field quantities in this case is independent of y co-ordinate 14, thus Equation (12) reduces to an ordinary, one-dimensional second order linear differential equation. Since the transverse variation of the longitudinal field components have a sinusoidal x-dependence in the core and decay exponentially in the cladding, solutions to the determinental equation for the TE modes can be obtained from the zeros of:

$$f(n_{\mathit{eff}}) = \sqrt{n_1^2 - n_{\mathit{eff}}^2} \sin(\sqrt{n_1^2 - n_{\mathit{eff}}^2} k_0 d) - \sqrt{n_{\mathit{eff}}^2 - n_2^2} \cos((\sqrt{n_1^2 - n_{\mathit{eff}}^2} k_0 d)) \quad 15$$

Likewise, the solutions to the determinental equation for the TM modes can be obtained from the zeros of $$g(n_{\mathit{eff}}) = n_2^2 \sqrt{n_1^2 - n_{\mathit{eff}}^2} \sin(\sqrt{n_1^2 - n_{\mathit{eff}}^2} k_0 d) - n_1^2 \sqrt{n_{\mathit{eff}}^2 - n_2^2} \cos((\sqrt{n_1^2 - n_{\mathit{eff}}^2} k_0 d)) \quad 16$$

These forms of the determinental equations were chosen to facilitate root-finding via the Newton-Raphson and secant methods.

Multilayer Dielectric Slab Waveguides

Numerical techniques may be used to characterize the layer structure of epitaxial wafers used in the present invention as best shown in FIG. 3. Such techniques allow a wide variety of complex structures to be characterized and may be suitable for determining the sensitivity of a waveguide design to various perturbations. Such techniques may further allow for efficient calculation of the waveguide effective index variation versus the depth of the etch process used to define the ridge waveguide.

For a one-dimensional slab waveguide problem in Cartesian co-ordinates, the relation between longitudinal and transverse field components yields:

TABLE 1

| TE | | TM | |
|---|---|---|---|
| $E_y = \frac{j\mu_0 \omega}{k^2 - \beta^2} \frac{\partial H_z}{\partial x}$ | (17) | $E_x = -\frac{j\beta}{k^2 - \beta^2} \frac{\partial E_z}{\partial x}$ | (19) |
| $H_x = -\frac{j\beta}{k^2 - \beta^2} \frac{\partial H_z}{\partial x}$ | (18) | $H_y = -\frac{j\omega\epsilon}{k^2 - \beta^2} \frac{\partial E_z}{\partial x}$ | (20) |

Alternatively, one may solve Equation (9) for the transverse component, $\psi_\beta = E_y$ or $H_y$, then use Faraday's law and Ampere's law to obtain the longitudinal component, $\psi_z$. The applicable equations are:

TABLE 2

| TE Modes | | TM Modes | |
|---|---|---|---|
| $H_z = -\frac{1}{j\omega\mu_0} \frac{\partial E_y}{\partial x}$ | (21) | $E_z = \frac{1}{j\omega\epsilon} \frac{\partial H_y}{\partial x}$ | (23) |
| $H_x = -\frac{\beta}{\omega\mu_0} E_y$ | (22) | $E_x = \frac{\beta}{\omega\epsilon} H_y$ | (24) |

The solution of Equation (9), in one dimension, x, poses a two-point boundary value problem. Since an arbitrary functional dependence of $k(x) = k_0 n(x)$ is allowed, use of assumed forms for the eigenfunction to obtain a determinental equation is generally not possible. We therefore must determine the eigenvalue and eigenfunction simultaneously. The "relaxation method" may be used to determine such solutions. The method derives its name from the way a series of trial solution relaxes to a solution $\psi_\beta = E_y$ or $H_y$ satisfying both the differential equation and the boundary conditions. The relaxation method converges rapidly when the initial or trial function is close to an eigenfunction and the initial eigenvalue is close to the true eigenvalue. This property makes the relaxation method particularly efficient when a series of similar eigenvalue problems need to be analyzed such as dispersion curves $\beta(\omega)$ or when the waveguide geometry is incrementally varied. The latter case occurs when etching slab waveguides to produce ridge waveguides.

The relaxation method requires converting the problem to state variable form:

$$q_1 \equiv \psi_\beta \quad (25)$$

$$q_2 \equiv \frac{\partial \psi_\beta}{\partial x}$$

$$q_3 \equiv \beta^2$$

Our eigenvalue problem is reformulated in terms of these state variables by expressing the time-independent Schrodinger equation as follows:

$$\frac{dq_1}{dx} = q_2 \quad (26)$$

$$\frac{dq_2}{dx} = (q_3 - k_0^2 n^2(x))q_1 \quad (27)$$

$$\frac{dq_3}{dx} = 0 \quad (28)$$

Expressing the differentials in Equations (26) through (28) as first order finite backward differences ($dq_i/dx\,|_{x=mh} = q_{i,m} - q_{i,m-1}/h$) where h is the thickness of a thin slab section, we obtain the following error equations:

$$F_{1,m} = q_{1,m} - q_{1,m1} - \frac{h}{2}(q_{2,m} + q_{2,m1}) \quad (29)$$

$$F_{2,m} = q_{2,m} - q_{2,m1} - \quad (30)$$
$$\frac{h}{4}(q_{3,m} + q_{3,m1} - K2_m - K2_{m1})(q_{1,m} + q_{1,m1})$$

$$F_{3,m} = q_{3,m} - q_{3,m1} \quad (31)$$

where $x_m = mh$ is the position of the 'm'th point (m=0, 1, . . . M), $F_{i,m}$ is a function for error in the the 'i'th state variable, and $K2_m \equiv k_0^2 n^2(x_m)$.

The relaxation method works by taking an initial state vector $\vec{q}_m = (q_{1,m}, q_{2,m}, q_{3,m})^T$ and finding the incremental changes in the state vector, $\Delta\vec{q}_m$ and $\Delta\vec{q}_{m-1}$, which reduce the errors generated by the application of Equations (29) through (31). A Taylor series expansion of the error vector $\vec{F}_m = (F_{1,m}, F_{2,m}, F_{3,m})^T$ therefore yields:

$$\vec{F}_m(\vec{q}_m + \Delta\vec{q}_m, \vec{q}_{m1} + \Delta q_{m1}) = \vec{F}_m(\vec{q}_m, \vec{q}_{m1}) + \quad (32)$$

$$\sum_{i=1}^{3} \frac{\partial \vec{F}}{\partial q_{i,m}} \Delta q_{i,m} +$$

$$\sum_{i=1}^{3} \frac{\partial \vec{F}}{\partial q_{i,m1}} \Delta q_{i,m}$$

The relaxation method converges when the left hand side of Equation (32) approaches zero; we may therefore rewrite Equation (32) as:

$$F_{i,m} = -\sum_{i'1}^{3}((S_{i,i'})_m \Delta q_{i',m1} + (S_{i,i'3})_m \Delta q_{i',m}) \quad (33)$$

where i=1,2,3. The following partial derivatives apply for each of the interior points (m=1, 2, . . . M−1) of the boundary value problem:

TABLE 3

| $(S_{i,i_n})_m$ | i = 1 | i = 2 | i = 3 |
|---|---|---|---|
| i" = 1 | 1 | $-\frac{h}{4}(q_{3,m} + q_{3,m1} - K2_m - K2_{m1})$ | 0 |
| i" = 2 | $-\frac{h}{2}$ | −1 | 0 |
| i" = 3 | 0 | $-\frac{h}{4}(q_{1,m} + q_{1,m1})$ | −1 |
| i" = 4 | 1 | $-\frac{h}{4}(q_{3,m} + q_{3,m1} - K2_m - K2_{m1})$ | 0 |
| i" = 5 | $-\frac{h}{2}$ | 1 | 0 |
| i" = 6 | 0 | $-\frac{h}{4}(q_{1,m} + q_{1,m1})$ | 1 |

The boundary conditions at x=0 and x=Mh must also be expanded in Taylor series, so the error functions at the boundaries are:

$$F_{3,0} = -\sum_{i'1}^{3}(S3, i')_0 \Delta q_{i',0} \quad (34)$$

(B.C. at x = 0)

$$F_{1,M} = -\sum_{i'1}^{3}(S1, i')_M \Delta q_{i',M} \quad (35)$$

(B.C. at x = Mh)

$$F_{2,M} = -\sum_{i'1}^{3}(S2, i')_M \Delta q_{i',M} \quad (36)$$

(2$^{nd}$ B.C. at x = Mh)

Note that three boundary conditions are required because the state vector $\{q_1, q_2=dq_1/dx\}$ has been augmented to include the unknown eigenvalue, $q_3=\beta^2$. Utilizing dielectric boundary conditions for TE modes, which predominate in semiconductor laser diodes, at x=0 and x=Mh, we have:

$$q_{2,0} = -\sqrt{q_{3,0} - K2_0}\, q_{1,0} \quad (37)$$

$$q_{1,M} = 1 \quad (38)$$

$$q_{2,M} = -\sqrt{q_{3,M} - K2_M}\, q_{1,M} \quad (39)$$

and

TABLE 4

| $(Si,i'')_m$ | i = 1 @ x = Mh | i = 2 @ x = Mh | i = 3 @ x = 0 |
|---|---|---|---|
| i" = 4 | $\sqrt{q_{3,0} - K2_0}$ | $\sqrt{q_{3,M} - K2_M}$ | 1 |
| i" = 5 | 1 | 1 | 0 |
| i" = 6 | $q_{1,0}/2\sqrt{q_{3,0} - K2_0}$ | $q_{1,M}/2\sqrt{q_{3,M} - K2_M}$ | 0 |

(We note that the i"=1, 2, 3 terms are unneeded since the boundary conditions do not involve m<0 or m=M−1).

The flexibility of the aforementioned approach enables us to analyze complex multilayer slab waveguide designs and to efficiently determine the sensitivity of such designs to perturbations.

Waveguide Analysis using the Effective Index Method

In a manner similar to that used for analysis of the simple dielectric slab waveguide 10b previously described, ridge-loaded optical waveguide 11 best shown in FIG. 2, with multilayer or graded index core 9 and cladding layer 8 may be analyzed using the effective index method. For the purposes of such analysis x,y, and z Cartesian coordinates may be used where x may be defined as the "transverse" direction 12, y as the "lateral" direction 14, and z as the longitudinal direction 13.

The effective index method is an approximation technique for analyzing dielectric waveguides. The effective index method is very accurate for weak wave guiding and is computationally efficient since it allows one to solve three one-dimensional scalar eigencharacterization problems rather than the two-dimensional vectorial problem. By expressing the eigenfunction $\psi_\beta(x, y)$ as the product $\psi 1(x) \cdot \psi 2(y)$ then Equation (12) can be factored and rewritten as:

$$\frac{1}{\psi_1(x)} \frac{d^2 \psi_1(x)}{dx^2} + k_0^2 n^2(x, y) = \beta^2(y) \tag{40}$$

$$\beta^2(y) \equiv \beta^2 - \frac{1}{\psi_2(y)} \frac{d^2 \psi_2(y)}{dy^2} \tag{41}$$

The second term in Equation (41) is the negative of the curvature of the lateral eigenfunction. If lateral (i.e. y) dependence of n (x, y) is small or slowly varying, then this term is small and negative over distances corresponding to the waveguide's width. Accordingly, $\beta^2(y)=\beta^2+\delta\beta_1^2$ in this region and $\psi_2$ exhibits cosinusoidal variation. At lateral distances far from the waveguide, we note that $\beta^2(y)=\beta^2-\Delta\beta_2^2$, and $\psi_2$ exhibit exponentially decaying variation so that we obtain:

$$\frac{d^2 \psi_2(y)}{dy^2} + (\beta^2(y) - \beta^2)\psi_2(y) \equiv 0 \tag{42}$$

where the effective index, $n_{\mathit{eff}}=\beta/k_0$, approximates the true value.

Mode Conversion

The general and complete solution to Equation (12) is a superposition of modes:

$$\psi(x, y) = \sum_\beta C_\beta \psi_\beta(x, y) \tag{12a}$$

where the dependence $e^{j(\omega t-\beta z)}$ is implicit and the summation is understood to represent an integral over continuous values of β to include radiation modes. The completeness of the set of solutions $\psi_\beta$ and the their associated modal propagation constant β are:

$$C_\beta = \frac{\int \phi_\beta(y)\phi^*(y)dy}{\int |\phi_\beta(y)|^2 dy \int |\phi(y)|^2 dy} \tag{12b}$$

where the relationships between $\psi(x,y)=\psi(x)\phi(y)$ and $\psi_\beta(x, y)=\psi(x)\phi_\beta(y)$ are relied upon and the common vertical dependance on $\psi(x)$ is canceled. Considering the example of a multi-lateral mode waveguide with two modes $\beta_1$ and $\beta_2$, then Equation (12b) implies that the amount of excitation of the multiple lateral modes given by $|C_{\beta 1}|^2$ and $|C_{\beta 2}|^2$ is equal to the magnitude of the square of the overlap integral of of modes with the single mode waveguide's mode given by $\psi(x,y)$. When judiciously designed, the mode converter may supply equal excitation for both modes of the multi-lateral mode waveguide such that $|C_{\beta 1}|^2=|C_{\beta 2}|^2$.

Figure 4:
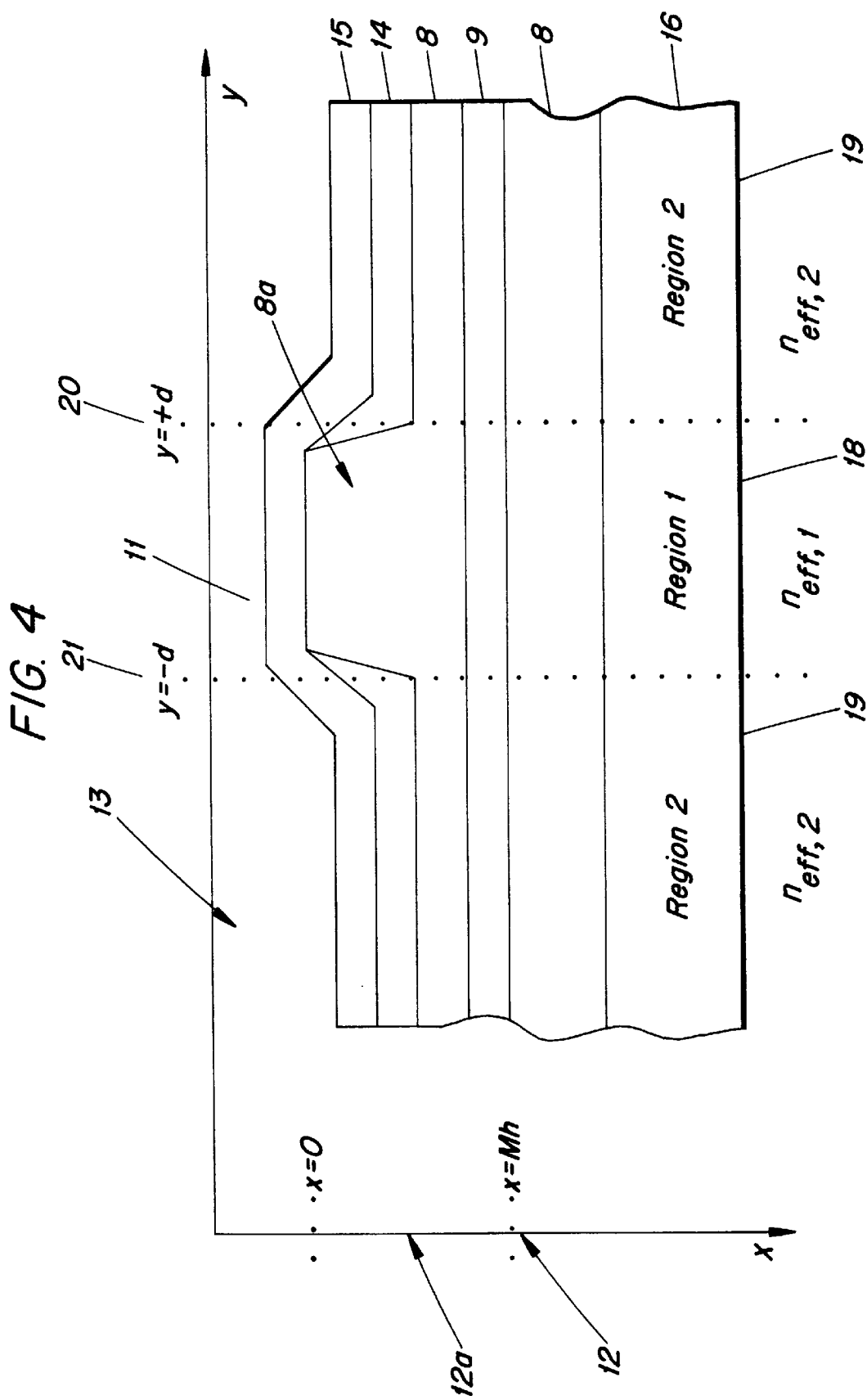
FIG. 4 is a diagram illustrating a cross section of the single or multi-lateral dielectric ridge waveguide of the present invention showing $n_{\mathit{eff},1}$ and $n_{\mathit{eff},2}$ regions.

In the particular case of ridge loaded waveguide 11 as best shown in FIG. 2, FIG. 3, and FIG. 4, the lateral eigenfunction is obtained from the uniform slab waveguide solutions presented previously with an interchange of the x and y co-ordinates. A ridge waveguide of the kind depicted in FIG. 2, FIG. 3, and FIG. 4, for example, are typically constructed, in the case of integrated optoelectronics devices, by thin film epitaxy of crystalline films on crystalline substrates of a variety of types. Substrate 17 may form the base layer for such epitaxy and may in the preferred embodiment be made of Gallium Arsenide (GaAs) typically used in the art to form substrates. Indium Phosphide (InP) may also be used for substrate 17. Lower cladding layer 8 may be deposited in such a manner on substrate 17 with a graded index or multilayer active region or core 9 being deposited thereupon. An upper cladding layer 8a into which a ridge and a residual cladding layer 8b may be etched form the basic structure of ridge waveguide semiconductor lasers. Dielectric layers 14 and 15 may further be deposited on etched upper cladding layer 8a and residual cladding layer 8b to isolate contact layer 16 from the device.

Figure 5:
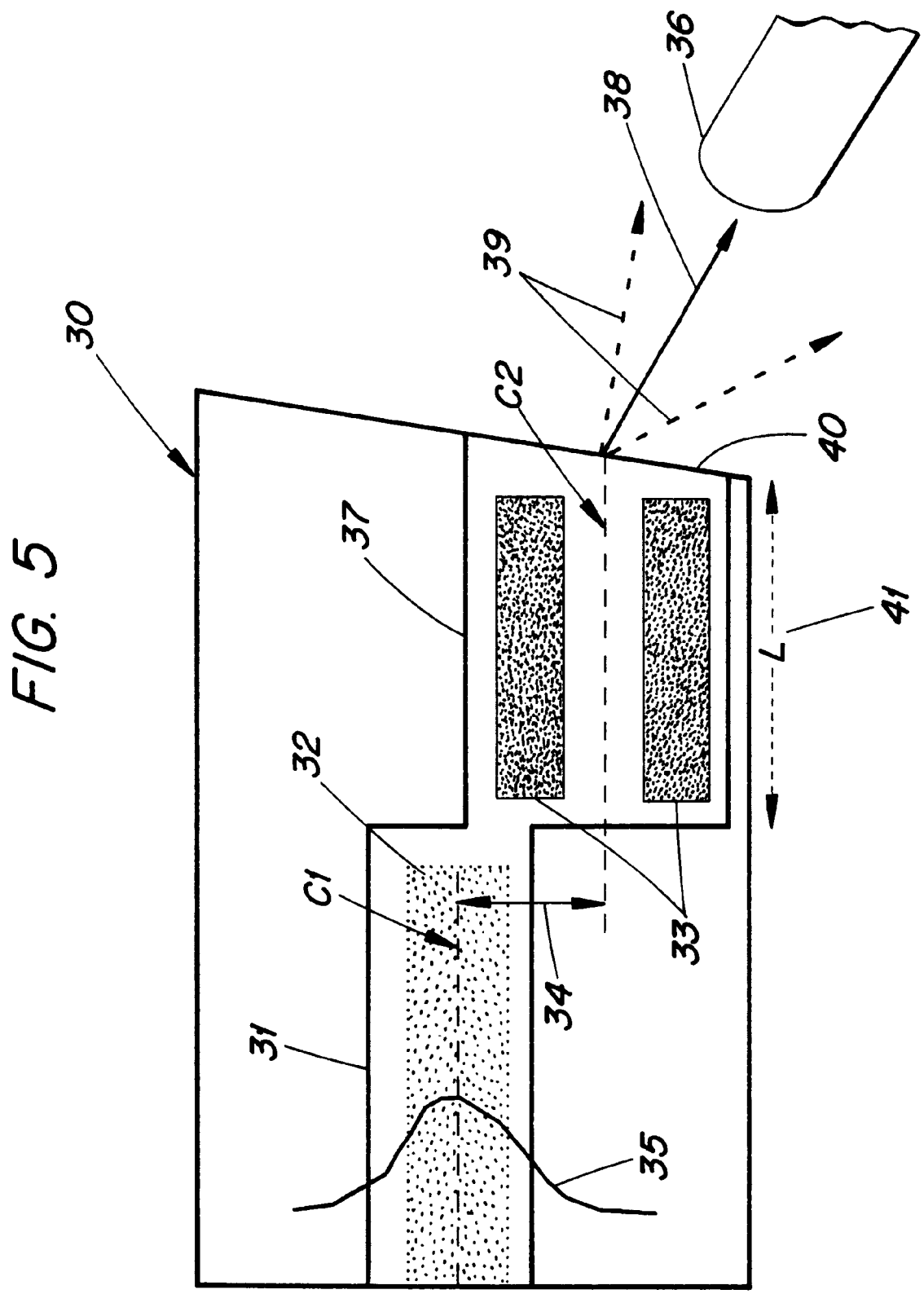
FIG. 5 is a view of the beam steering apparatus of the present invention.
Figure 5A:
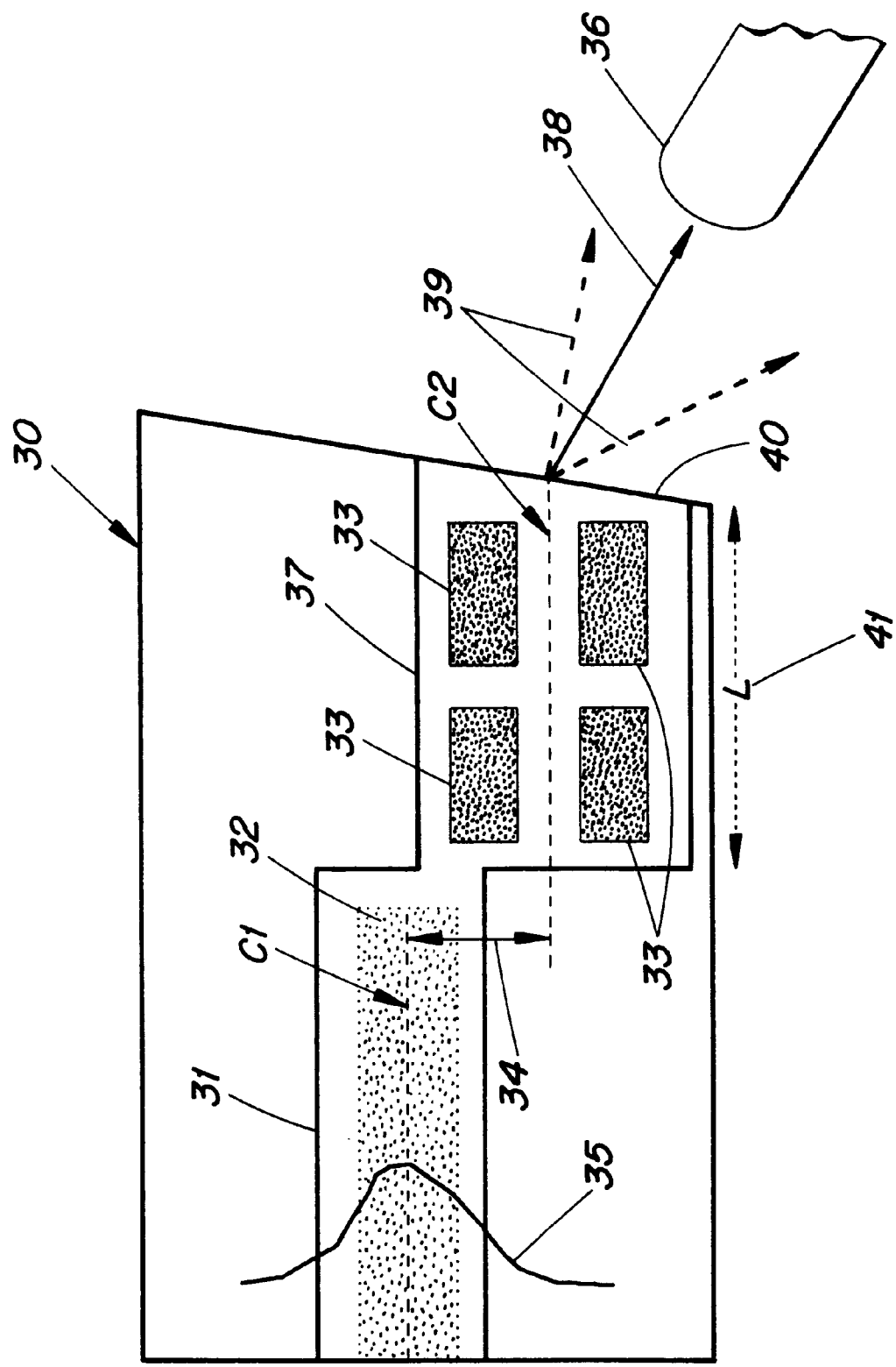
FIG. 5A is another embodiment of the beam steering apparatus of the present invention.

The operation of the present invention can be best illustrated with an example of an embodiment of device 30 as best shown in FIG. 5. Device 30 includes single mode waveguide 31, which may typically be a 2 μm wide single mode ridge waveguide, and multi-lateral mode waveguide 37, which may be a 3 μm wide multi-lateral mode waveguide. While device 30 is shown constructed using a ridge structure, a buried ridge structure, a regrown structure, or any index guided structure may be used to practice the present invention. Both waveguides 31 and 37 are confined by the ridge structure using an lateral index difference of $\delta_n=0.02$ in a material with a modal average refractive index (computed in one dimension along the vertical direction) of 3.25 at a wavelength of 1.55 μm. From the modal propagation constants, $\beta_1$ and $\beta_2$, one computes the difference, δβ, and the length over which the intermodal phase difference changes by 360 degrees. This length is given by $$P = \frac{2\pi}{\delta \beta}.$$

In the example given here P=130 μm. Setting the length of multi-lateral mode waveguide 37 to L=P/4=32 μm establishes an initial intermodal phasing of 90 degrees. The mode conversion is effected by offsetting waveguides 31 and 37 laterally. For example, an ε=+1.65 μm lateral offset 34 results in nearly equal overlap of the single guided mode of waveguide 31 with the two guided modes of the multi-lateral mode waveguide 37.

Figure 6:
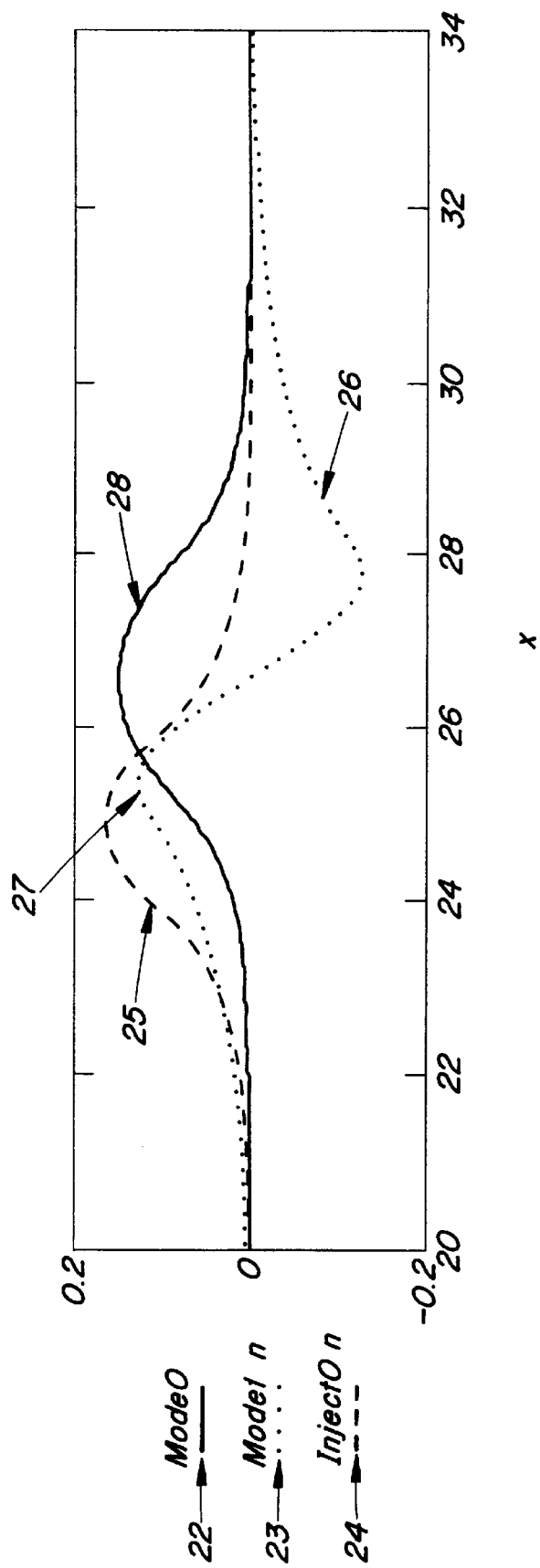
FIG. 6 is a graph illustrating the relationship between field amplitude and waveguide cross-sectional position.

As best shown in FIG. 6, the relationship between field amplitude and lateral position depends on which one of various modes of a laser beam is transmitted through the waveguide. Line 22 represents the transmission relationship for the fundamental lateral mode of transmission or Mode0 of the multi lateral mode waveguide as shown in the graph legend. The second order lateral mode transmission of the multi-lateral mode waveguide is represented by line 23 or Mode1 as shown in the graph legend. Finally, the injected mode of the single mode waveguide is represented with line 24 or Inject0 as shown in the graph legend.

Figure 7:
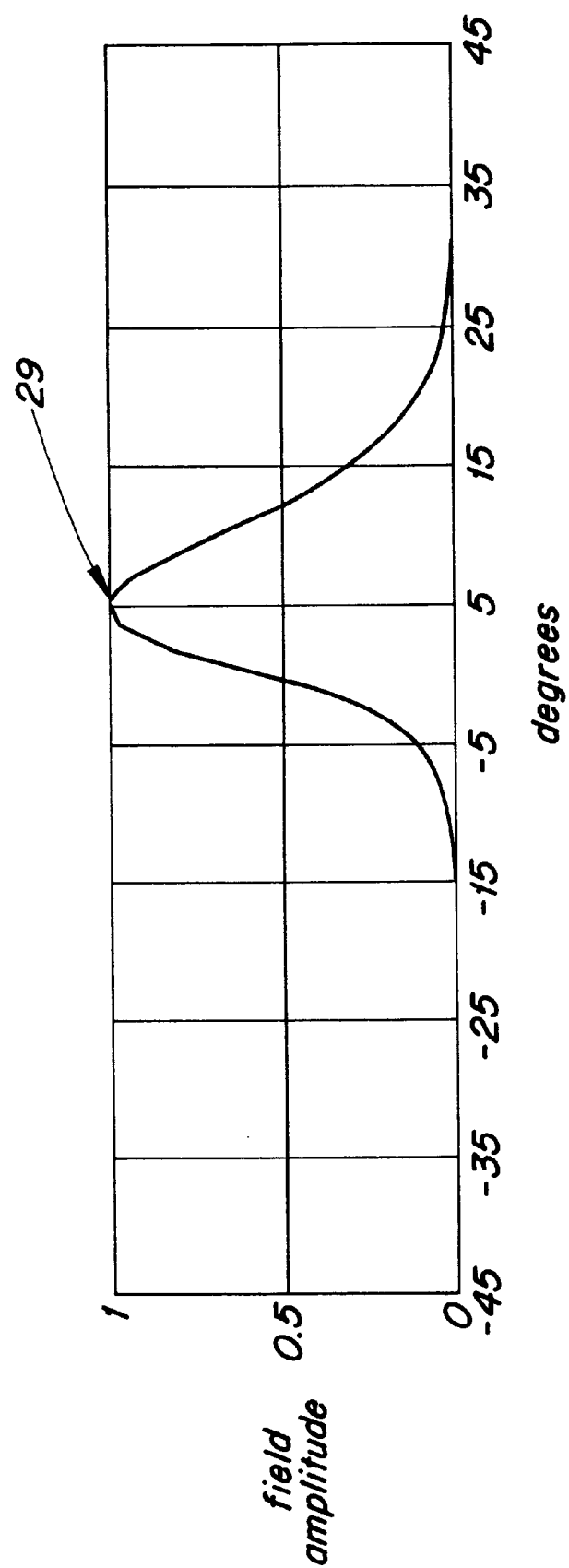
FIG. 7 is a is a graph illustrating the relationship between optical intensity and Farfield beam pattern.

In this example, maximum amount of beam steering at nearly +/−5.5 degrees occurs when the admixture of the two guided modes of the multi-lateral mode waveguide at the facet is $$+\frac{1}{\sqrt{2}}$$

as shown in plot 29 of FIG. 7. In other words, the beam steering maximum occurs when transmission modes are equally weighted $$\left(\frac{1}{\sqrt{2}}\right)$$

and are out of phase by −90 degrees at facet 40. Intermodal phase difference is controlled by the sign of the waveguide displacement (ε) 34, length, L, 41 of multi-lateral mode waveguide 37, and by the characteristics of the steering current injected into multi-lateral mode waveguide 37 at beam steering electrode 33. Since the multi-lateral mode waveguide 37 is, in relative terms, quite short, the junction and parasitic capacitances of the region subject to modulation are much smaller than in a conventional laser. Smaller modulation regions lead to the ability of the device to handle higher frequency modulation and higher bitrates, simplifies the design of high speed drivers, reduces chirp, and improves the extinction ratio while allowing use of high laser bias needed for high speed operation. The present invention therefore decouples the laser bias and modulation problems.

The present invention therefore integrates signal modulation with an active electronic alignment function by precisely steering the beam into a single optical fiber, multiple fibers, or other optical components commonly used in the art such as optical amplifiers and the like. The present invention therefore greatly improves the productivity and manufacturability of fiber coupled laser and semiconductor laser optical amplifier modules. By providing the capability of high frequency beam steering, the present invention also offers the potential to spatially demultiplex time-division multiplex (TDM) signals by steering the signal between separate optical fibers and/or receivers.

Beam steering structure 30 as shown in FIG. 5 may be disposed internally to the lasing cavity or externally from the lasing cavity to form an extended laser cavity. Beam steering structure 30 may further be constructed in a hybrid fashion as an external device coupled to a laser source. If an Intra cavity wavelength determining reflecting structure, such as a distributed Bragg reflector (DBR), or an integrated Fabry-Perot (FP) reflector is present (EXP), device 30 acts as an external-cavity, integrated structure. If device 30 is not interposed between an integrated reflector and facet 40, then device 30 acts as an external modulator.

The present invention therefore comprises an integrated beam steering device 30 and modulation method for converting the single lateral mode of single mode waveguide 31 of device 30 into two or more modes of multi-mode waveguide 37. The method of the present invention controls the phase difference between the modes at device facet 40. In alternative embodiments, integrated optical device 30 may be constructed using many different reflector types including Distributed Bragg Reflector (DBR), etched facet, and cleaved facet reflectors for example. Unlike devices of the prior art, device 30 of present invention does not rely on adjustments of the current or carrier distribution to affect the lateral refractive index profile and refract the beam. Device 30 of the present invention represents an advance over the devices of the prior art by avoiding gain guiding. Device 30 further obviates the need for relying on separate, usually numerous, radiating elements or external, usually mechanical, devices for beam steering. Device 30 and the method of the present invention further do not involve the use of multiple external beams interacting through the photorefractive effect. The present invention does not rely on thermal effects that severely limit modulation speed.

While specific embodiments of the present invention have been described and illustrated herein, it is to be understood that such embodiments are provided by way of example only. It can easily be appreciated by those skilled in the art that various parameters and structure may be changed without departing from the spirit and the scope of the invention as limited solely by the appended claims.

I claim:

1. In a semiconductor laser device, an intermodal phase difference controller for beam angle modulation, said controller comprising:
   a first optical waveguide for carrying a first optical signal having a first mode and providing a first optical output signal;
   a second optical waveguide coupled to said first optical waveguide for carrying a second optical output signal; and
   a mode converter coupled to said first optical waveguide and said second optical waveguide, said mode converter configured to:
   convert said first optical signal in said first mode into said second optical signal having two or more second modes having a variable intermodal phase difference introduced by said converter to provide said beam angle modulation; and
   couple said second optical output signal to said second optical waveguide.

2. The controller of claim 1 wherein said first optical waveguide further comprises an active single mode optical waveguide.

3. The controller of claim 2 wherein said first mode further includes a vertical mode and a lateral mode.

4. The controller of claim 2 wherein said first mode further includes a vertical mode and a lateral mode for both quasi-TE and quasi-TM modes.

5. The controller of claim 1 wherein said second optical waveguide further comprises an index guided multi-lateral mode waveguide.

6. The controller of claim 5 wherein said two or more modes are combined in a predetermined admixture.

7. The controller of claim 6 wherein a predetermined lateral offset is provided in said mode converter, said predetermined lateral offset for controlling said predetermined admixture.

8. The controller of claim 1, wherein said intermodal phase relationship between said two or more modes is determined by a control signal applied to said mode converter.

9. The controller of claim 8 wherein said control signal further comprises a current injected into said second optical waveguide.

10. The controller of claim 9 wherein said second optical waveguide further comprises at least one beam steering electrode and wherein said injected current further comprises at least one current signal injected into said at least one beam steering electrode.

11. The controller of claim 8 further comprising an angled facet for receiving and outputting said two or more modes of said second optical output signal, said angled facet for increasing the magnitude of said beam angle modulation.

12. A method for beam steering in a semiconductor laser device comprising:

receiving a first optical signal having a first mode in a first optical waveguide;

converting said first optical signal into a second optical signal having at least two second modes and introducing a variable intermodal phase difference therebetween; and controlling a beam direction of said second optical signal by varying said intermodal phase difference.

13. The method according to claim 12 wherein said step of receiving said first optical signal having said first mode further includes receiving a said first optical signal having a lateral mode.

14. The method according to claim 12 wherein said step of receiving said first optical signal having said first mode further comprises receiving said first optical signal having a vertical mode.

15. The method according to claim 12 wherein said step of converting said first optical signal into said second optical signal having said second mode further comprises:

receiving said first optical signal having said first optical mode, offsetting said first optical waveguide from said second optical waveguide by a predetermined lateral distance, generating said at least two second modes in said second waveguides in response to said step of offsetting by said predetermined lateral distance, and varying a carrier density in said second waveguide to introduce said variable intermodal phase difference.

16. The method according to claim 15 wherein said at least two secondary modes comprise multi-lateral modes.

17. The method according to claim 16 wherein said step of controlling the beam direction of said second optical signal further comprises:

constructing said second optical waveguide as an index guided multi-lateral mode waveguide; and index guiding said at least two multi-lateral modes in said second optical waveguide.

18. The method according to claim 15 wherein said step of controlling the beam direction of said second optical signal further comprises:

generating a current;

injecting said generated current into said second optical waveguide;

generating a predetermined intermodal phase difference between said at least two second modes in said second optical signal using said injected current.

19. The method according to claim 12 wherein said step of controlling the beam direction further comprises:

converting said second optical signal into at least two multi-lateral modes;

changing the propagation constant independently for each mode of said two or more multi-lateral modes; and generating an intermodal phase difference between said two or more multi-lateral modes.

\* \* \* \* \*